(12) United States Patent
Kuo et al.

(10) Patent No.: US 8,524,608 B1
(45) Date of Patent: Sep. 3, 2013

(54) METHOD FOR FABRICATING A PATTERNED STRUCTURE OF A SEMICONDUCTOR DEVICE

(75) Inventors: Lung-En Kuo, Tainan (TW);
Jiunn-Hsiung Liao, Tainan (TW);
Hsuan-Hsu Chen, Tainan (TW);
Meng-Chun Lee, Taichung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/456,245

(22) Filed: Apr. 26, 2012

(51) Int. Cl.
*H01L 21/302* (2006.01)
*H01L 21/461* (2006.01)

(52) U.S. Cl.
USPC .......... 438/717; 438/738; 257/E21.214; 257/E21.218

(58) Field of Classification Search
USPC .......... 438/689, 700, 717, 735, 736, 738; 257/E21.218, E21.214
See application file for complete search history.

(56) References Cited

U.S. PATENT DOCUMENTS

| 8,003,540 B2* | 8/2011 | Bok ............................. 438/703 |
| 2008/0248429 A1 | 10/2008 | Chou |
| 2009/0258500 A1 | 10/2009 | Yang |

* cited by examiner

*Primary Examiner* — Hoai V Pham
(74) *Attorney, Agent, or Firm* — Winston Hsu; Scott Margo

(57) ABSTRACT

The present invention provides a method for fabricating a patterned structure in a semiconductor device, which includes the following processes. First, a target layer, a first mask and a first patterned mask are sequentially formed on a substrate. Then, a first etching process is performed to form a plurality of characteristic structures on the substrate, wherein each of the characteristic structures comprises a patterned first mask and a patterned target layer. A second patterned mask is formed on the substrate, wherein the second patterned mask covers a portion of the characteristic structures and exposes a predetermined region. A second etching process is performed to fully eliminate the characteristic structures within the predetermined region. Finally, a third etching process is performed to fully eliminate the target layer not covered by the patterned first mask.

17 Claims, 6 Drawing Sheets

METHOD FOR FABRICATING A PATTERNED STRUCTURE OF A SEMICONDUCTOR DEVICE

BACKGROUND OF THE INVENTION

1. Field of the Invention

The present invention generally relates to the field of fabricating patterned structures, and more particularly, to a method for fabricating a patterned structure in a semiconductor device.

2. Description of the Prior Art

Integrated circuits (IC) are made of devices and interconnections, which are formed through patterned features in different layers. During the fabrication process of ICs, the photolithography is an essential technique. The photolithography is used to form designed patterns, such as implantation patterns or layout patterns, on at least a photomask, and then to precisely transfer such patterns to a photoresist layer by exposure and development steps. Finally, by performing several semiconductor processes such as ion implantation, etching process, or deposition, complicated and sophisticated IC structures can be obtained.

With the continuous miniaturization of semiconductor devices and the remarkable advance in fabrication techniques of semiconductor devices, the conventional lithography process meets its limitation due to printability and manufacturability problems. To meet the requirements of device design rules which continue to push the resolution limits of existing processes and tooling, a double patterning technique (DPT) has been developed and taken as one of the most promising lithographic technologies for 32 nanometer (nm) node and 22 nm node patterning, since it can increase the half-pitch resolution up to twice higher by using current infrastructures. For example, the litho-etch-litho-etch (LELE) approach, also called 2P2E, is one of the most common DPTs for fabricating patterns in a semiconductor device. When a 2P2E approach is carried out, a target layer, such as a polysilicon layer, located on a substrate will first be covered with an etch mask in order to define regions for forming patterns. Then, a plurality of stripe patterned target layers, which are parallel to each other, are formed by performing the first litho-etch process. Finally, a second litho-etch process is performed in order to cut out or split a portion of the stripe patterned target layers. Through the preceding processes, structures with relatively high resolution can be obtained. However, there are still many drawbacks that need to be overcome. For example, some target layer residues (or called polysilicon residues) may remain on the substrate lying between each of the stripe patterned target layers. In another case, during or after the second litho-etch process, the stripe patterned target layer (or called stripe patterned polysilicon) may be exposed from the overlying etch mask due to a trimming effect. As a result, if an epitaxial growth process is carried out, epitaxial structures will form on the target layer residues or on the exposed stripe patterned target layer, which therefore decreases the yield of the devices.

Accordingly, in order to overcome the above-mentioned drawbacks, there is a need to provide a modified method for fabricating a patterned structure with a better yield.

SUMMARY OF THE INVENTION

One objective of the invention is therefore to provide a method for fabricating a patterned structure which can overcome drawbacks such as the remaining target layer residues and the exposure of the target layer.

To address these and other objectives, the present invention provides a method for fabricating a patterned structure in a semiconductor device, which includes the following processes. First, a target layer, a first mask and a first patterned mask are sequentially formed on a substrate. Then, a first etching process is performed to etch away a portion of the first mask and a portion of the target layer using the first patterned mask as an etching mask, so that a plurality of characteristic structures is formed on the substrate, wherein each of the characteristic structures comprises a patterned first mask and a patterned target layer. A second patterned mask is formed on the substrate, wherein the second patterned mask covers a portion of the characteristic structures and exposes a predetermined region. A second etching process is performed to fully eliminate the characteristic structures within the predetermined region so that a first trench is formed in the predetermined region. Finally, a third etching process is performed to fully eliminate the target layer not covered by the patterned first mask by using the patterned first masks as etching masks.

The present invention provides the first etching process and the third etching process respectively to first eliminate a portion of the target layer exposed from the photoresist layer and etch away the entire target layer within the predetermined region. Hence, no target layer may remain between the characteristic structures on the substrate and no patterned target layer may be exposed from the overlying patterned first mask. Therefore, the yield of the final devices will be increased.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings:

FIGS. 2-6 depict a series of schematic diagrams of a method for fabricating a patterned structure of a semiconductor device in accordance with one embodiment of the invention, wherein:

FIG. 2 is a schematic diagram showing a substrate having a target layer, a first mask layer and a first patterned mask layer thereon;

Figure 1:
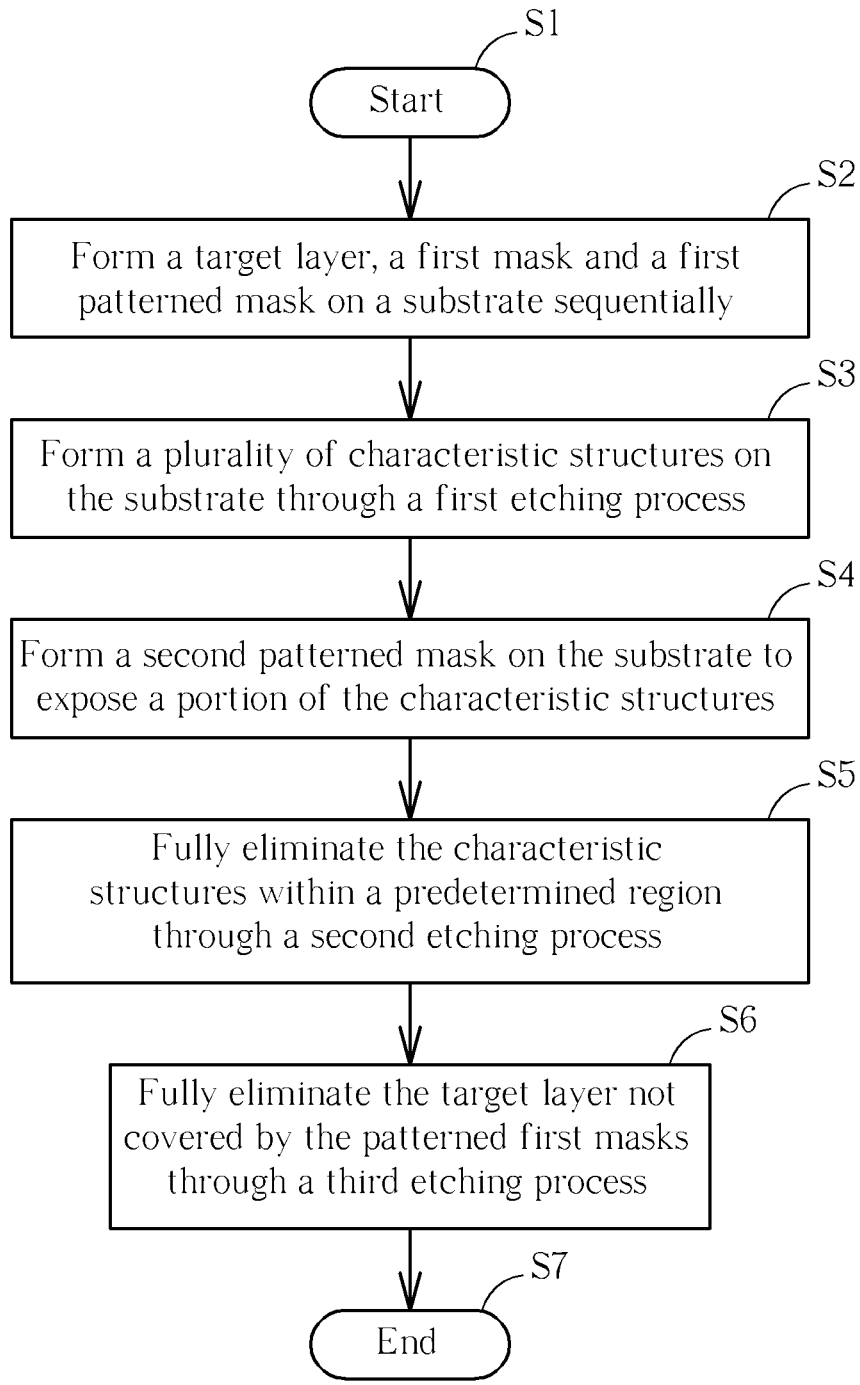
FIG. 1 depicts a flow diagram for a method for fabricating a patterned structure of a semiconductor device according to one embodiment of the invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Please refer to FIG. 1, which depicts a flow chart of a method for fabricating a patterned structure of a semiconductor device based on a double patterning technique (DPT) according to one embodiment of the invention. The flow is simply described as follows. Beginning at step S1 and followed by step S2, a target layer, a first mask and a first patterned mask are sequentially formed on a substrate. Then, at step S3, a plurality of characteristic structures is formed on the substrate through a first etching process, wherein each of the characteristic structures comprises a patterned first mask and a patterned target layer. Subsequently, at step S4, a second patterned mask is formed on the substrate to cover most of the characteristic structures and exposes a portion of the characteristic structures within a predetermined region. Then, at step S5, the characteristic structures within the predetermined region are fully eliminated through a second etching process. Finally, at step S6, a third etching process is performed by using the patterned first masks as etching masks so that the target layer not covered by the patterned first masks can be fully eliminated. After that, step S7 and subsequent processes may be performed.

Figure 2:
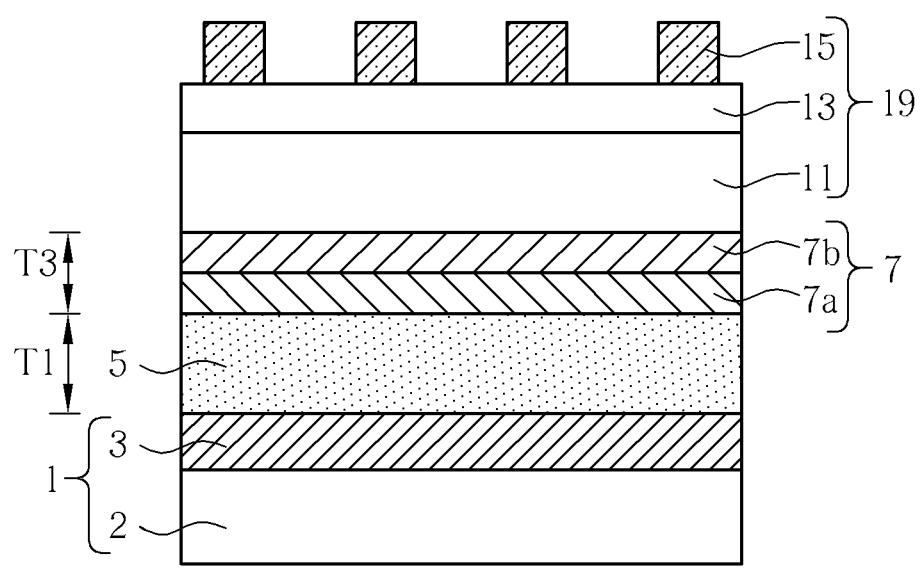

The method described above is an overview of the present invention for fabricating a patterned structure of a semiconductor device based on a double patterning technique (DPT). In the following paragraphs, embodiments related to the fabrication of gate patterns by utilizing the DPT will further be described in detail. Please refer to FIGS. 2 to 6 accompanied with FIG. 1, wherein FIGS. 2 to 6 depict a series of schematic diagrams of a method for fabricating a patterned structure of a semiconductor device in accordance with one embodiment of the invention. First, as shown in FIG. 2, a substrate 1 is provided, which includes a base 2 and an isolation layer 3 disposed thereon. A target layer 5, a first mask layer 7 and a first patterned mask layer 19 are then formed sequentially, wherein the isolation layer 3 may include silicon oxide, high-k dielectric material or the likes. The isolation layer 3 may be formed through a thermal oxidation process, a high density plasma CVD (HPCVD) process or a sub atmosphere CVD (SACVD) process, but is not limited thereto. Additionally, the base 2 may be a semiconductor base, such as silicon base, silicon germanium (SiGe) base, silicon-on-insulator (SOI) base or the likes. Depending on different requirements, the target layer 5 may be chosen from a single crystal silicon layer, a polycrystalline silicon, an amorphous silicon or the likes, preferably polycrystalline silicon. The first mask 7 may be a single-layered structure or a multi-layered stack structure, preferably a double-layered stack structure including silicon nitride 7a and silicon oxide 7b from bottom to top, but is not limited thereto. The first patterned mask 19 consists of stacked layers, where layers from bottom to top include an amorphous carbon layer, such as advanced patterning film (APF); an anti-reflective layer 13, such as dielectric material preferably chosen from silicon oxide, silicon nitride and the combination thereof; and a photoresist layer 15.

In this embodiment, the position of subsequent characteristic structures will be defined by the pattern of the photoresist layer 15 in the first patterned mask 19. It should be noted that, since the amorphous carbon layer 11 has a high aspect ratio (HAR), a low line edge roughness (LER) and a PR-like ashability, it is widely used in semiconductor nodes processes beyond 60 nanometer (nm). Additionally, the first patterned mask 19 is not limited to the structures described above; in another case, it may be replaced with a bottom PR/anti-reflective layer/top PR tri-layered structure, such as an i-line PR/SHB layer/193 PR structure, wherein the SHB is an abbreviation of silicon-containing hard-mask bottom anti-reflection coating. In this embodiment, the target layer 5 preferably has a first thickness T1 ranging from 600 angstrom to 1000 angstrom and the thickness T3 of the first mask 7 is preferably smaller than the first thickness T1, but is not limited thereto.

Figure 3A:
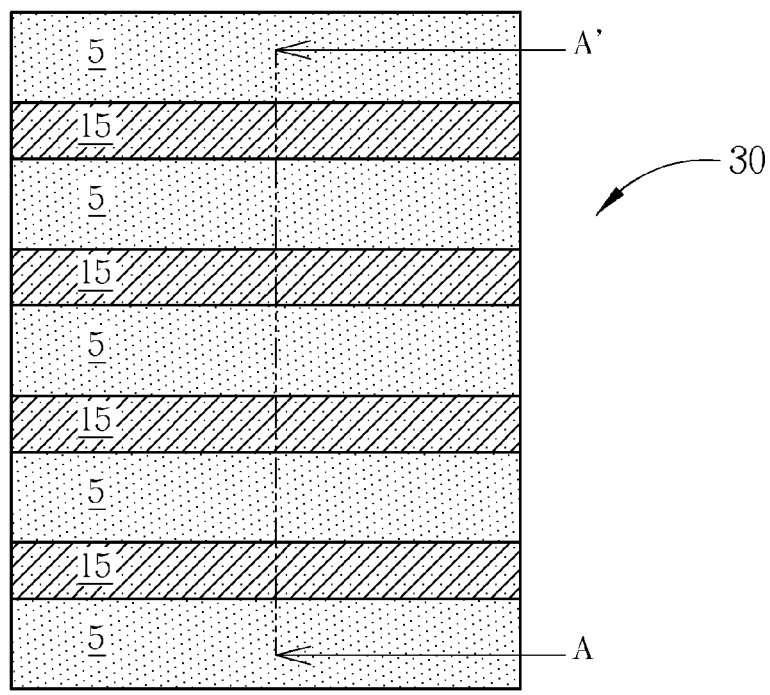
FIGS. 3(A) and 3(B) are schematic diagrams respectively showing a cross-sectional and a top view of a substrate having a plurality of characteristic structures thereon after accomplishing a first etching process.
Figure 3B:
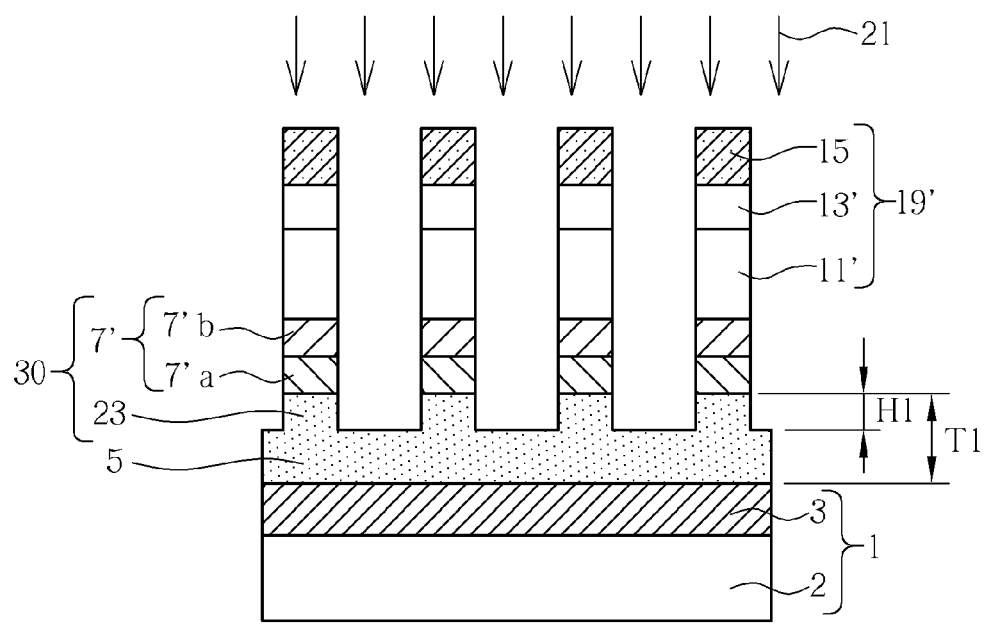

Please refer to FIGS. 3(A) and 3(B). FIG. 3(A) is a schematic top view showing a substrate having a plurality of characteristic structures thereon after a first etching process is completed, while FIG. 3(B) is a cross-sectional diagram taken along a line AA' in FIG. 3(A). After the preceding processes, a subsequent first etching process 21 is performed by using the photoresist layer 15 as a mask to eliminate a portion of the anti-reflective layer 13, a portion of the amorphous carbon layer 11, a portion of the first mask 7 and a portion of the target layer 5. The first etching process 21 described above may include a single etching recipe or a multiple etching recipe According to this embodiment, the first etching process 21 is preferably a single etching process, such as a main etch recipe (ME). For example, according to the preferred embodiment, the aforesaid first etching process may use etchant gas comprising at least tetrafluoromethane ($CF_4$), hydrogen-containing fluoromethane such as trifluoromethane ($CHF_3$) or an inert gas, such as nitrogen and argon, but is not limited thereto. A plurality of characteristic structures 30 is formed on the substrate 1 after the first etching process 21, wherein the characteristic structures 30 may include stripe structures or column structures, and preferably stripe structures. At this time, each of the characteristic structures 30 includes a patterned first mask 7' (including a patterned silicon nitride 7'a and a patterned silicon oxide 7'b) and a patterned target layer 23 covered by the patterned first patterned mask 19'. The first patterned mask 19' includes a carbon layer 11', an anti-reflective layer 13' and the photoresist layer 15 in principle but, depending on etchant compositions and related parameters, some of the amorphous carbon layer 11 may remain only while the anti-reflective layer 13' and the photoresist layer 15 are etched away completely after the etching process.

It is worth noting that, in the present invention, the first etching process 21 only etches a portion of the target layer 5 down to a first determined depth H1. It does not etch through the target layer 5 and expose the isolation layer 3. In other words, since only the portion of the target layer 5 exposed from the photoresist layer 15 is etched away through the first etching process 21, the patterned target layers 23 in each of the characteristic structures 30 has a first height H1 (also deemed as first depth H1), preferably, the first height H1 is shallower than or equal to one-third of the first thickness T1 of the target layer 5. One feature of the present invention is that a portion of the target layer 5 exposed from the photoresist layer 15 is etched down to a first predetermined depth H1 to avoid over etching of the patterned first mask 7' in subsequent etching processes.

Figure 4A:
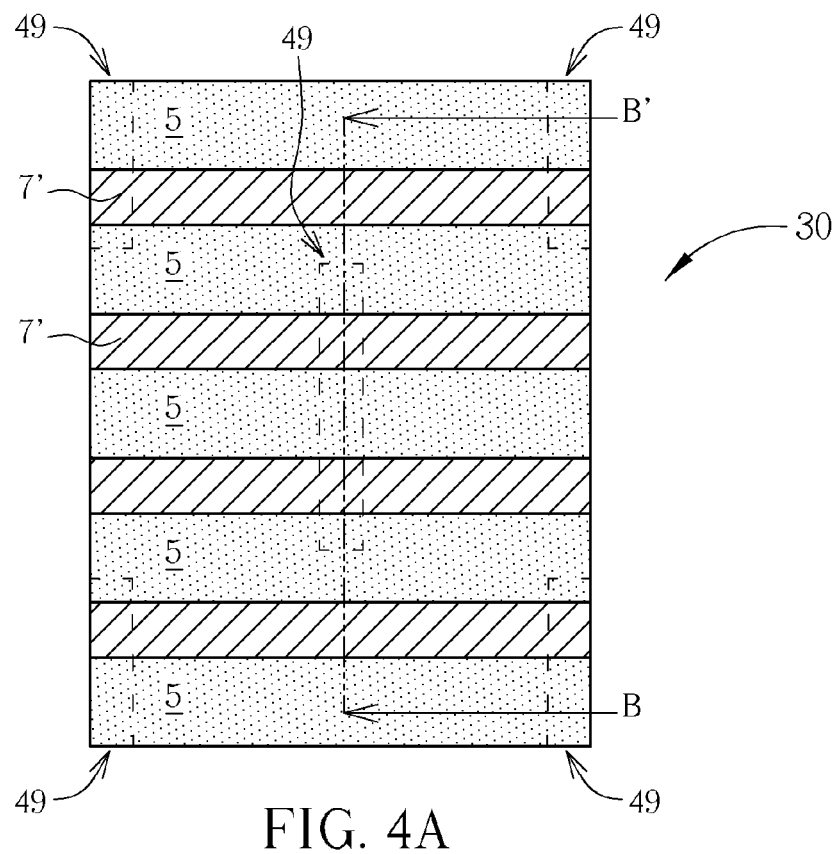
FIGS. 4(A) and 4(B) are schematic diagrams respectively showing a cross-sectional and a top view of a substrate having a second patterned mask later thereon.
Figure 4B:
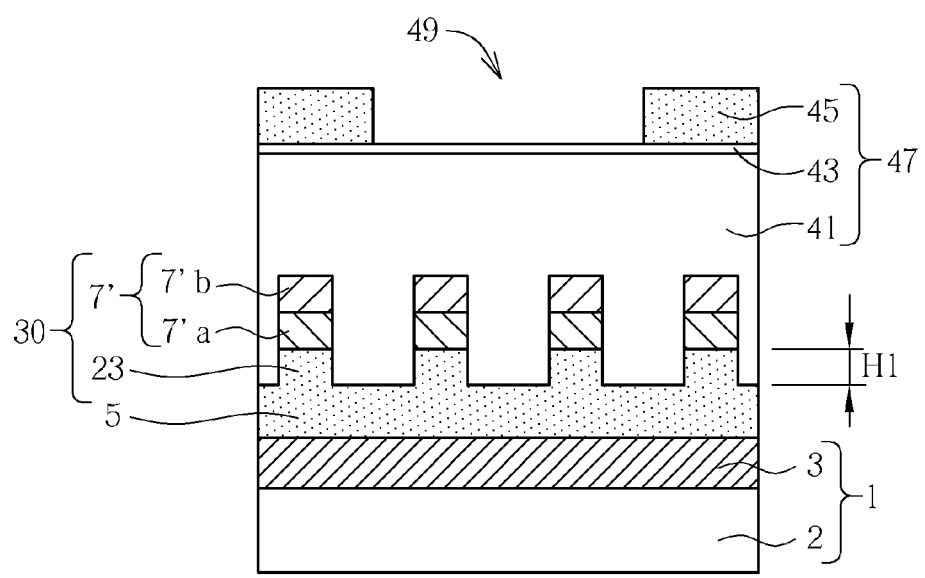

The remaining first patterned mask 19' is eliminated by regular procedures. Now, please refer to FIGS. 4(A) and 4(B). FIG. 4(A) is schematic diagrams showing a top-view of a substrate having a second patterned mask layer thereon, while FIG. 4(B) is a cross-sectional diagram taken along a line BB' in FIG. 3(A). A second patterned mask 47 is formed on the substrate 1. According to this embodiment, the second patterned mask 47 includes a tri-layered structure of bottom PR 41/anti-reflective layer 43/top PR 45, such as an i-line PR/SHB layer/193 PR structure. A structure based on the i-line PR/SHB layer/193 PR structure will be described in the following paragraphs. First, a bottom PR 41, like an i-line PR, is coated on and between the characteristic structures 30 in order to fill up a gap between each of the characteristic structures 30. Optionally, a baking procedure may further be performed to harden the i-line PR. Subsequently, an anti-reflective layer 43, such as an SHB, is formed. According to the preferred embodiment, the SHB layer 43 comprises organo-silicon polymers or polysilane comprising at least a chromophore group and a crosslinkable group. In other cases, the SHB layer 43 may further comprise a cross-linking agent. Finally, after coating the SHB layer 18, a top PR 45, such as an 193 nm PR or an ArF PR, is coated on the SHB layer 43. According to the present invention, the top PR 45 does not need to be very thick because the main function of the top PR 45 is merely to transfer the pattern defined in the top PR 45 to the underlying SHB layer 43 and acts as a dry etching hard mask when etching the SHB layer 43 during pattern transfer. It should be noted that, in this embodiment, the top PR 45 in the second patterned mask 47 may cover a portion of the characteristic structures 30 and exposes a predetermined region A. As shown in FIG. 4(A), several predetermined regions A are arrayed on the substrate 1 so that a section of each of the characteristic structures 30 is not covered by the top PR 45.

Figure 5A:
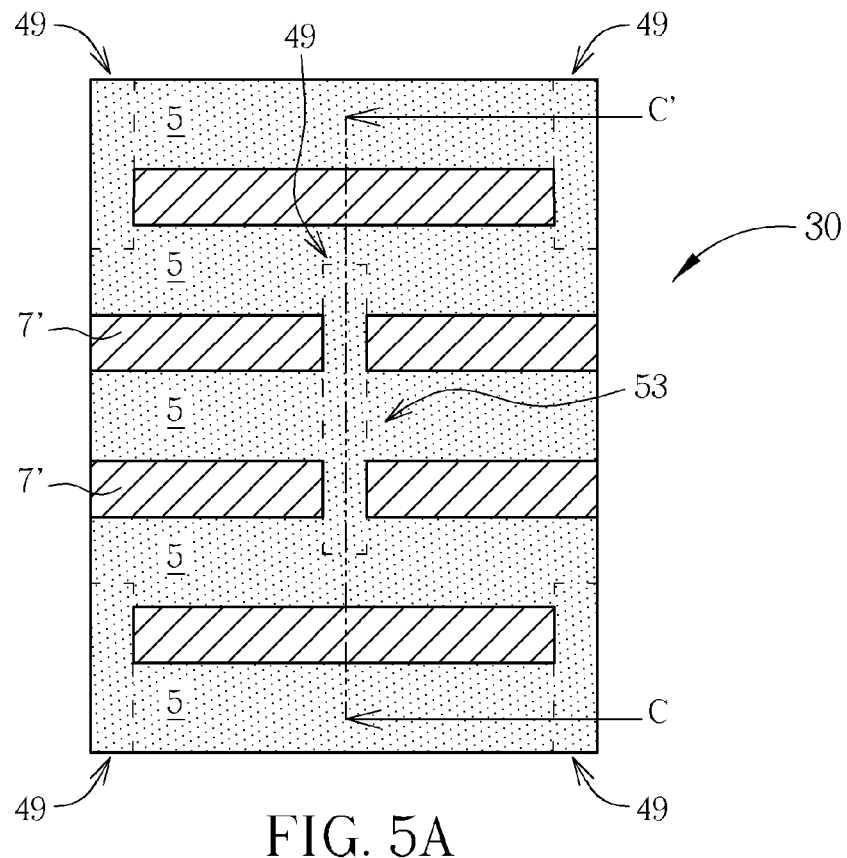
FIGS. 5(A) and 5(B) are schematic diagrams respectively showing a cross-sectional and a top view of a substrate having no characteristic structures thereon within a predetermined region after accomplishing a second etching process.
Figure 5B:
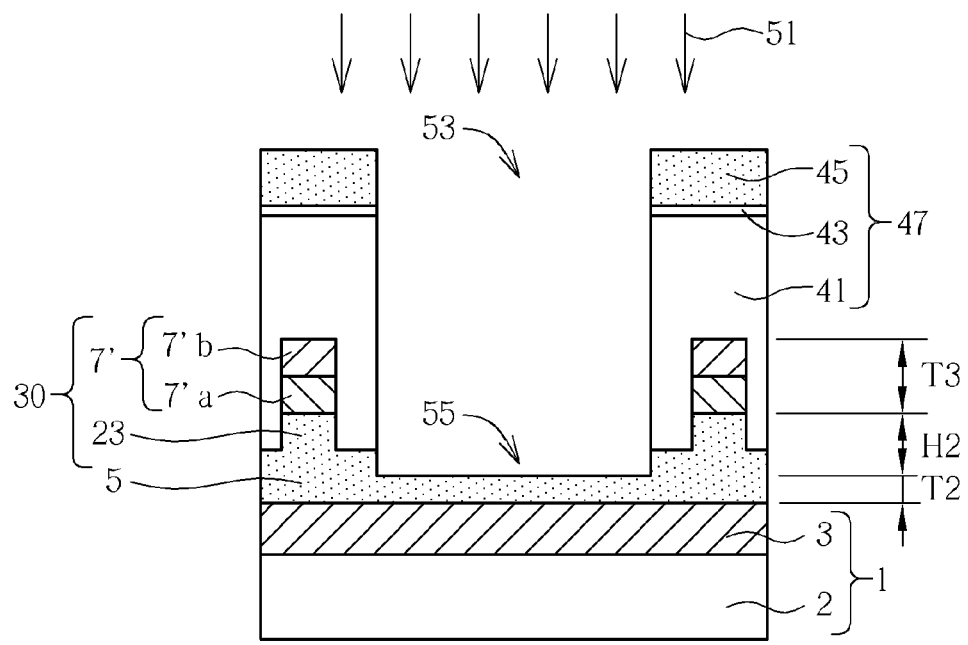

Please refer to FIGS. 5(A) and 5(B). FIG. 5(A) is a schematic top view showing a substrate having no characteristic structures within a predetermined region after a second etching process is completed, while FIG. 5(B) is a schematic, cross-sectional diagram taken along a line CC' in FIG. 5(A). As shown in FIG. 5(A), a second etching process 50 is performed to fully eliminate the characteristic structures 30 and a portion of the second patterned mask 47 within the predetermined region A. The detailed procedures are described as follows. First, the anti-reflective layer 43 and the bottom PR 41 exposed from the top PR 45 are etched through one kind of etching recipe until the underlying characteristic structures 30 are almost exposed. Then, the remaining bottom PR 41 and the exposed characteristic structures 30 are etched away concurrently by applying another etching recipe. In addition, the etching ratio of the characteristic structures 30 to the bottom PR 41 is substantially from 1.5 to 0.7, preferably 1. After the above processes, a first trench 53 with flat bottom 55 may be obtained. In this embodiment, the second etching process 51 described above belongs to a dry etching process, which includes two kinds of etching recipes. An etchant gas in this etching process may comprise at least tetrafluoromethane ($CF_4$), hydrogen-containing fluoromethane such as trifluoromethane ($CHF_3$) or an inert gas, such as nitrogen and argon, but is not limited thereto. In other cases, the second etching process 51 may include more than two etching recipes, but is not limited thereto. It is worth noting that, in this embodiment, the second etching process 51 etches the characteristic structures 30 within the predetermined region A to a second predetermined depth H2, and however, it does not etch through the target layer 5 and does not expose the underlying isolation layer 3. Additionally, the second predetermined depth H2 is preferably shallower than or equal to one-third of the first thickness T1 of the target layer 5. Therefore, the target layer 5 within the predetermined region A still has the second thickness T2, which is preferably thicker than 500 angstrom.

In addition, the thickness T3 of the patterned first mask 7' is not reduced during the first etching process 21 and the second etching process 51.

Figure 6A:
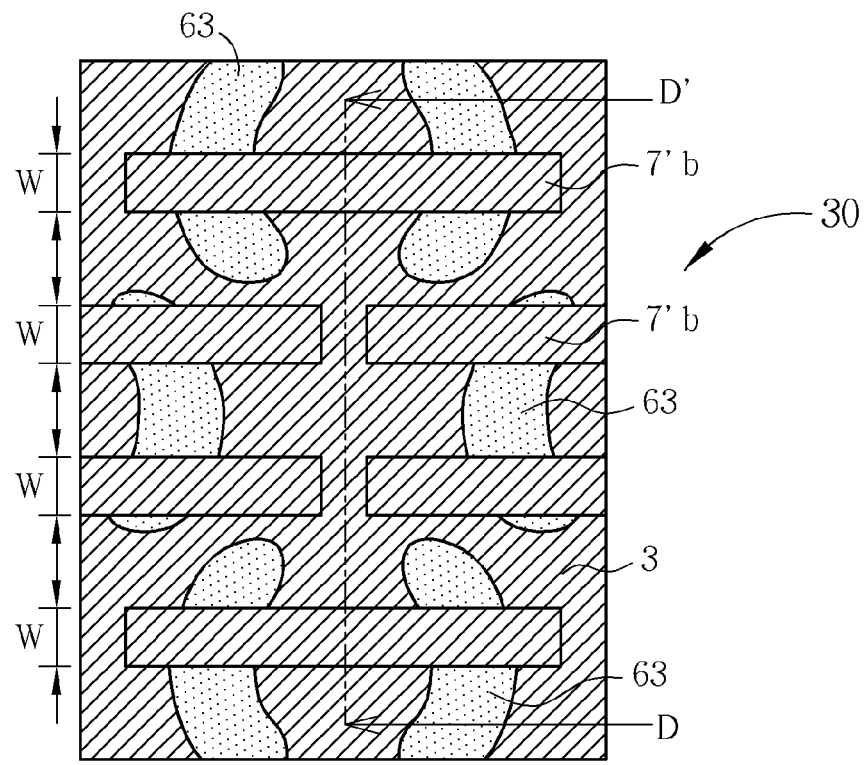
FIGS. 6(A) and 6(B) are schematic diagrams respectively showing a cross-sectional and a top view of a substrate having no target layer thereon after accomplishing a third etching process.
Figure 6B:
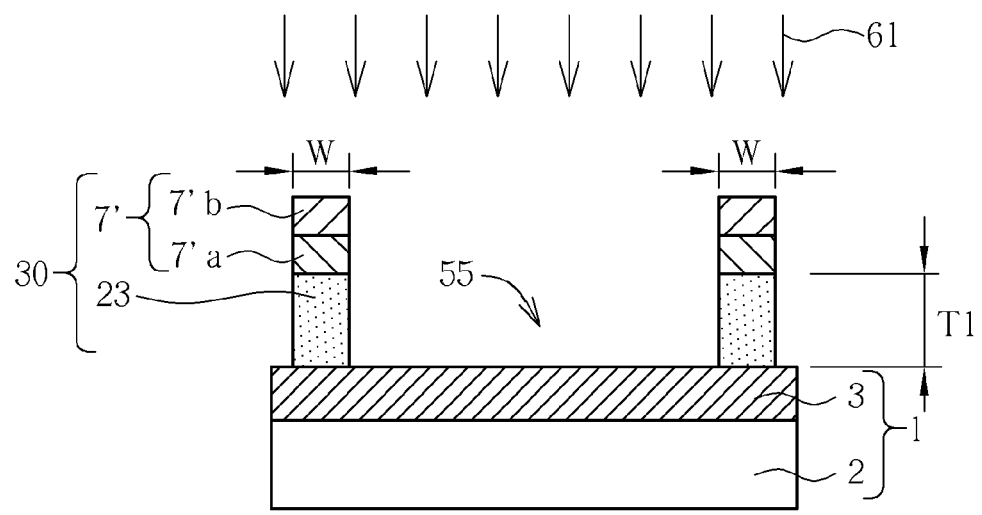

The remaining second patterned mask 47 is then eliminated after the preceding procedure (depending on different etching situation, it is possible that only a portion of the bottom PR remains after the above etching process, that is to say, all anti-reflective layers and top PR are eliminated) .Please refer now to FIGS. 6(A) and 6(B). FIG. 6(A) is a schematic top view of a substrate having no target layer thereon after a third etching process is completed, while FIG. 6(B) is a cross-sectional diagram taken along a line DD' in FIG. 6(A). A third etching process 61 is performed to fully eliminate the target layer 5 exposed from the patterned first mask 7' by using the patterned first mask 7' as etching masks, more specifically, the target layer 5 within the predetermined region A is fully eliminated so that each characteristic structure 30 is cut off and a portion of the isolation layer 3 in the substrate 1 is exposed. Similarly, the third etching process 61 may includes several etching recipes, such as a main etch recipe, a soft landing recipe and an over etch recipe, but is not limited thereto. Compared to the main etch recipe, the soft landing recipe and the over etch recipe have relatively high etching selectivity towards the target layer 5. In this way, the isolation layer 3 serving as a gate oxide will not be over etched and pitting defects will not appear during the soft landing recipe. As a result, the quality of the final devices can be assured. At this time, the patterned structure according to the present invention is accomplished. One feature of the invention is that a portion of the target layer 5 is partially etched away (but not etched through) during the first etching process 21 and the second etching process 51. In this way, an etching duration of the third etching process 61 may be shortened so that target layer is not over etched in this situation. In addition, since the patterned first masks 7' are protected respectively by the first patterned masks 19 and the second patterned mask 47 during the 2P2E procedures (that is, the first etching process 21 and the second etching process 51) for defining the characteristic structures 30 and the predetermined region A, the patterned first masks 7' will not be over etched during the performance of the third etching process 61 and can keep an uniform profile to transfer patterns to the underlying target layer 5. Because a portion of the target layer 5 is etched away during the first etching process 21 and the second etching process 51, no target layer 5 will remain within the predetermined region A after the third etching process 61. As shown in FIG. 6(A), if corresponding procedures, such as spacer deposition, active region 63 doping process, epitaxial growth process (like selective epitaxial growth), etching process and so forth, are carried subsequently, the characteristic structures 30 can be a part of the stripe gate structures serving to control on-off states of the channel regions. In addition, the patterned target layer 23 remaining on the substrate 1 or exposed from patterned first mask 7' does not exist anymore so that there are no improper sites for the growth of epitaxial structures.

In summary, the present invention provides the first etching process 21 and the third etching process 61 to eliminate a portion of the target layer 5 exposed from the photoresist layer 15 and to etch away the entire target layer 5 within the predetermined region A respectively. Hence, no target layer 5 (or also called polysilicon) may remain on the substrate 1 between the characteristic structures 30 and no patterned target layer 23 (also called patterned polysilicon) may be exposed from the overlying patterned first mask 7'. Therefore, if an epitaxial growth processes is carried out in subsequent processes, no defects structures, such as epitaxial bumps or epitaxial extrusion structures, will be formed around the target layer 5, which therefore improve the yield of the final device. In addition, for the sake of clarity, a double patterning technique (DPT) is only applied in a gate structure pattern in the preceding paragraphs. However, the present invention can also be applied to any semiconductor patterning process to form a well-patterned structure, such as fin structures, interlayer dielectric (ILD) contact holes or via holes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a patterned structure in a semiconductor device, comprising:
    forming a target layer, a first mask and a first patterned mask on a substrate sequentially;
    performing a first etching process to etch away a portion of the first mask and a portion of the target layer by using the first patterned mask as an etching mask so that a plurality of characteristic structures is formed on the substrate, wherein each of the characteristic structures comprises a patterned first mask and a patterned target layer;
    forming a second patterned mask on the substrate, wherein the second patterned mask covers a portion of the characteristic structures and exposes a predetermined region;
    performing a second etching process to fully eliminate the characteristic structures and the second patterned mask within the predetermined region so that a first trench is formed in the predetermined region; and
    after forming the first trench, performing a third etching process to fully eliminate the target layer exposed from the patterned first mask by using the patterned first masks as etching masks.

2. The method according to claim 1, wherein the target layer comprises a single crystal silicon layer, polycrystalline silicon or amorphous silicon.

3. The method according to claim 1, wherein the characteristic structures comprise stripe structures or column structures.

4. The method according to claim 1, wherein the first patterned mask or the second patterned mask comprises a multi-layered stack structure.

5. The method according to claim 4, wherein the first patterned mask comprises an amorphous carbon layer, an antireflective layer and a photoresist layer sequentially.

6. The method according to claim 4, wherein steps for forming the second patterned mask comprise steps of forming a bottom photoresist layer, a silicon containing antireflective layer and a top photoresist layer sequentially.

7. The method according to claim 1, wherein the first etching process etches a portion of the target layer down to a first determined depth and does not etch through the target layer.

8. The method according to claim 7, wherein the first determined depth is shallower than or equal to one-third of a thickness of the target layer.

9. The method according to claim 8, wherein the target layer has a first thickness ranging from 600 angstrom to 1000 angstrom.

10. The method according to claim 1, wherein the second patterned mask is present between each of the characteristic structures.

11. The method according to claim 1, wherein the first patterned mask is removed completely before forming the second patterned mask.

12. The method according to claim 1, wherein the second etching process etches a portion of the target layer down to a second determined depth and does not etch through the target layer.

13. The method according to claim 1, wherein the second determined depth is shallower than or equal to one-third of a thickness of the target layer.

14. The method according to claim 1, wherein the first trench has a flat bottom.

15. The method according to claim 1, wherein the third etching process etches away the entire target layer within the predetermined region.

16. The method according to claim 1, wherein after completing the third etching process, it further comprises:
    performing an epitaxial growth process to form a single crystal structure, wherein the single crystal structure does not contact any of the patterned target layers.

17. The method according to claim 1, wherein an isolation layer is further disposed on the substrate and is between the target layer and the substrate, and the third etching process can etch through the target layer and expose the isolation layer from the target layer after.

* * * * *